(12) United States Patent
Nakabayashi et al.

(10) Patent No.: US 10,825,802 B2
(45) Date of Patent: Nov. 3, 2020

(54) LIGHT EMITTING DEVICE

(71) Applicant: NICHIA CORPORATION, Anan (JP)

(72) Inventors: Takuya Nakabayashi, Tokushima (JP); Yukiko Yokote, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/360,750

(22) Filed: Mar. 21, 2019

(65) Prior Publication Data

US 2019/0295994 A1    Sep. 26, 2019

(30) Foreign Application Priority Data

Mar. 22, 2018   (JP) ................................ 2018-055031

(51) Int. Cl.
| | | |
|---|---|---|
| *H01L 25/075* | (2006.01) | |
| *H01L 33/62* | (2010.01) | |
| *H01L 33/54* | (2010.01) | |
| *H01L 33/50* | (2010.01) | |
| *H01L 33/48* | (2010.01) | |
| H01L 33/64 | (2010.01) | |

(52) U.S. Cl.
CPC ........ *H01L 25/0753* (2013.01); *H01L 33/483* (2013.01); *H01L 33/505* (2013.01); *H01L 33/507* (2013.01); *H01L 33/54* (2013.01); *H01L 33/62* (2013.01); *H01L 33/641* (2013.01)

(58) Field of Classification Search
CPC ..... H01L 25/0753; H01L 33/62; H01L 33/54; H01L 33/505; H01L 33/507; H01L 33/483; H01L 33/641; H01L 2933/0091; H01L 33/60; H01L 33/486

USPC .......................................................... 257/88
See application file for complete search history.

(56) References Cited

U.S. PATENT DOCUMENTS

| | | | |
|---|---|---|---|
| 2009/0146176 A1 | 6/2009 | Oishi | |
| 2010/0258830 A1 | 10/2010 | Ide et al. | |
| 2012/0319150 A1 | 12/2012 | Shimomura et al. | |
| 2017/0062684 A1* | 3/2017 | Ikeda | .................. H01L 25/0753 |

FOREIGN PATENT DOCUMENTS

| | | |
|---|---|---|
| JP | 2009146935 A | 7/2009 |
| JP | 2013004807 A | 1/2013 |
| JP | 2013143430 A | 7/2013 |

(Continued)

*Primary Examiner* — Fernando L Toledo
*Assistant Examiner* — Adam S Bowen
(74) *Attorney, Agent, or Firm* — Hunton Andrews Kurth LLP

(57) ABSTRACT

A light emitting device includes: a substrate including a base member including an upper surface, a lower surface and one or more lateral surfaces, and defining a recess that is opened at the upper surface and the lateral surfaces and surrounds an outer perimeter of the upper surface; a first light emitting element; a second light emitting element; a light guide member covering the first and the second light emitting elements and the upper surface of the base member; and a first reflective member having a closed-ring shape surrounding the upper surface of the base member and the light guide member, a portion of the first reflective member being located in the recess. At least one of the lateral surfaces of the base member and corresponding at least one of one or more outer lateral surfaces of the first reflective member are in the same plane.

9 Claims, 6 Drawing Sheets

(56) References Cited

FOREIGN PATENT DOCUMENTS

| | | |
|---|---|---|
| JP | 2013219260 A | 10/2013 |
| JP | 2014072213 A | 4/2014 |
| JP | 2018022758 A | 2/2018 |
| WO | 2009066430 A1 | 5/2009 |

\* cited by examiner

LIGHT EMITTING DEVICE

CROSS-REFERENCE TO RELATED APPLICATION

This application claims priority to Japanese Patent Application No. 2018-055031, filed on Mar. 22, 2018, the disclosure of which is hereby incorporated by reference in its entirety.

BACKGROUND

The present disclosure relates to a light emitting device. Japanese Patent Publication No. 2014-072213 describes a light emitting device including a substrate, an LED chip mounted on the substrate, a phosphor layer above the LED chip, and a dam member surrounding the LED chip.

SUMMARY

A light emitting device according to one embodiment of the present invention includes: a substrate including a base member including an upper surface, a lower surface located opposite to the upper surface, and one or more lateral surfaces located between the upper surface and the lower surface, and defining a recess that is opened at the upper surface and the lateral surfaces and surrounds an outer perimeter of the upper surface, and first wiring portions disposed on the upper surface of the base member; a first light emitting element electrically connected with corresponding ones of the first wiring portions and disposed on the corresponding ones of the first wiring portions, the first light emitting element having an emission peak wavelength of 430 nm or greater and less than 490 nm; a second light emitting element electrically connected with corresponding ones of the first wiring portions and disposed on the corresponding ones of the first wiring portions, the second light emitting element having an emission peak wavelength of 490 nm or greater and 570 nm or less; a light guide member covering the first light emitting element, the second light emitting element and the upper surface of the base member, the light guide member being spaced apart from the recess; and a first reflective member having a closed-ring shape surrounding the upper surface of the base member and the light guide member, and being in contact with the light guide member, a portion of the first reflective member being located in the recess. At least one of the lateral surfaces of the base member and corresponding at least one of one or more outer lateral surfaces of the first reflective member are in the same plane.

According to the light emitting device according to one embodiment of the present invention, it is possible to provide a light emitting device in which a joining strength between a substrate and a first reflective layer can be improved.

DETAILED DESCRIPTION

Figure 1A:
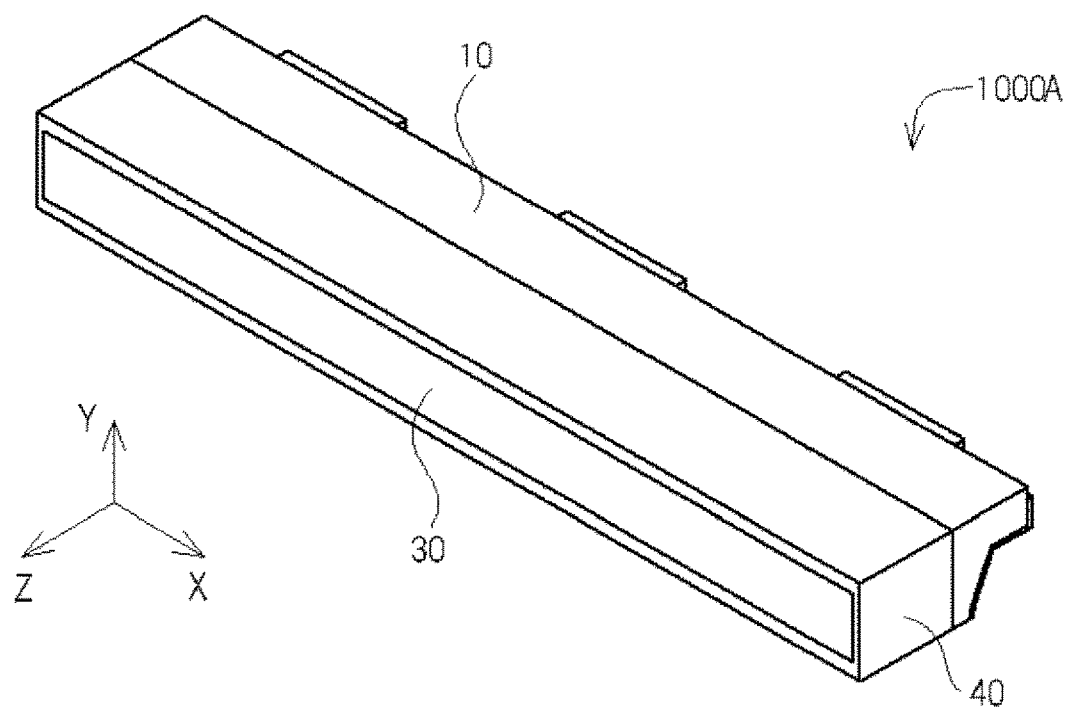
FIG. 1A is a schematic perspective view of a light emitting device in a first embodiment of the present disclosure.
Figure 1B:
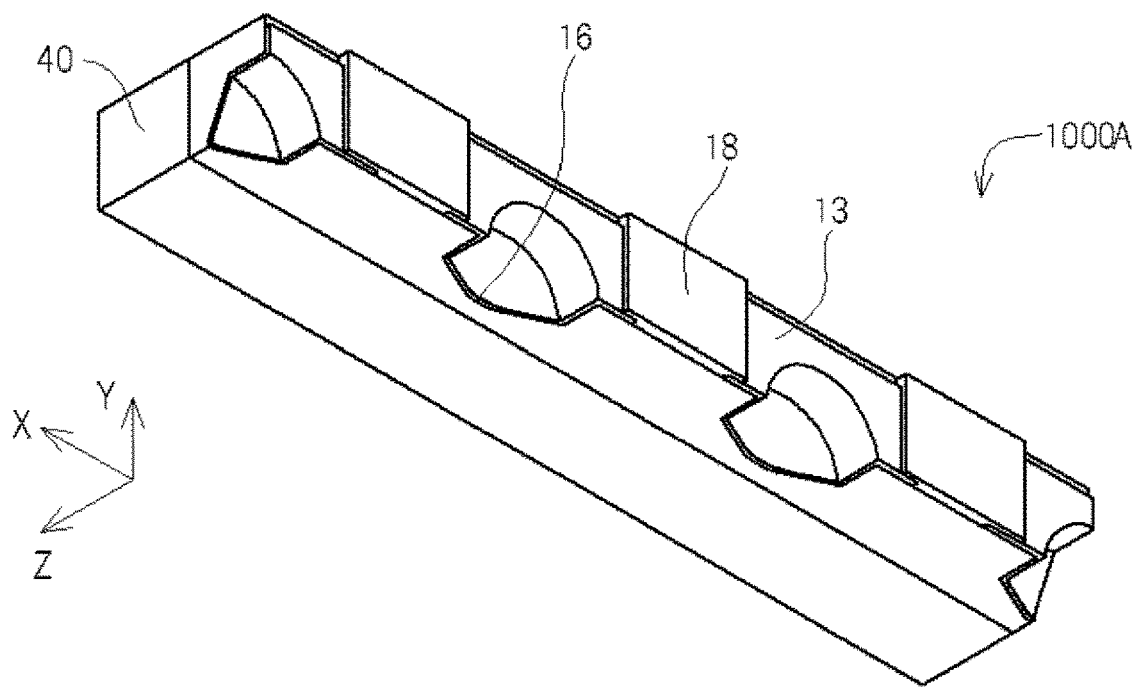
FIG. 1B is a schematic perspective view of the light emitting device in the first embodiment of the present disclosure.

Hereinafter, certain embodiments of the present invention will be described with reference to the attached drawings. Light emitting devices described below embody the technological idea of the present invention, and scope of the present invention is not limited to the description below unless otherwise specified. A content described in one embodiment is applicable to other embodiments and variant examples. In the drawings, the size, positional arrangement or the like may be exaggerated for clear illustration.

First Embodiment

Light emitting devices 1000A, 1000B and 1000C according to a first embodiment of the present invention will be described with reference to FIG. 1A through FIG. 8. As shown in, for example, FIG. 2B, the light emitting device 1000A includes a substrate 10, a first light emitting element 20A, a second light emitting element 20B, a light guide member 50, and a first reflective member 40. The substrate 10 includes a base member 11 and first wiring portions 12. The base member 11 includes a upper surface 111, a lower surface 112 located opposite to the upper surface 111, and lateral surfaces 113 located between the upper surface 111 and the lower surface 112. Further, the base member 11 defines a recess 115 opened toward the upper surface 111 and the lateral surfaces 113 of the base member 11, and surrounding an outer perimeter of the upper surface 111. The first wiring portions 12 are disposed on the upper surface 111 of the base member 11. The first light emitting element 20A is disposed on corresponding ones of first wiring portions 12 and is electrically connected with the corresponding first wiring portions 12. The first light emitting element 20A has an emission peak wavelength of 430 nm or greater and less than 490 nm. The second light emitting element 20B is disposed on corresponding ones of the first wiring portions 12 and is electrically connected with the corresponding first wiring portions 12. The second light emitting element 20B has an emission peak wavelength of 490 nm or greater and 570 nm or less. The light guide member 50 covers the first light emitting element 20A, the second light emitting element 20B and the upper surface 111 of the base member 11, and is spaced apart from the recess 115 of the base member 11. In other words, the recess 115 is not covered by the light guide member 50. The first reflective member 40 is located in the recess 115 of the base member 11, and surrounds the upper surface 111 of the base member 11 and the light guide member 50. The first reflective member 40 has a ring shape in a top view. The first reflective member 40 is in contact with the light guide member 50. At least one of the lateral surfaces 113 of the base member 11 and corresponding at least one of outer lateral surfaces 412 of the first reflective member 40 are in the same plane. In this specification, the term "in the same plane" allows a tolerance of about ±5 μm.

The substrate 10 may include one or more recessed portions 16 each opened at the lower surface 112 and a corresponding one of the lateral surfaces 113 of the base member 11. The substrate 10 may further include second wiring portions 13, one or more third wiring portions 14 and vias 15. The second wiring portions 13 are disposed on the lower surface 112 of the base member 11. Each third wiring portion 14 covers an inner wall of each recessed portion 16 of the base member 11 and is electrically connected with a corresponding one of the second wiring portions 13. Each via 15 is provided in a through-hole extending from the upper surface 111 to the lower surface 112 of the base member 11, and electrically connects a corresponding one of the first wiring portions 12 and a corresponding one the second wiring portions 13 to each other.

The first reflective member 40 is located in the recess 115 of the base member 11. Such a structure allows for increasing a contact area between the base member 11 and the first reflective member 40, and thus a joining strength between the substrate 10 and the first reflective member 40 can be increased. The light guide member 50 is spaced apart from the recess 115 of the base member 11. Such a structure allows for increasing the contact area between the base member 11 and the first reflective member 40, and thus the joining strength between the substrate 10 and the first reflective member 40 can be increased. The first reflective member 40 is disposed at an outer peripheral surface of the base member 11 as a single body.

Figure 3:
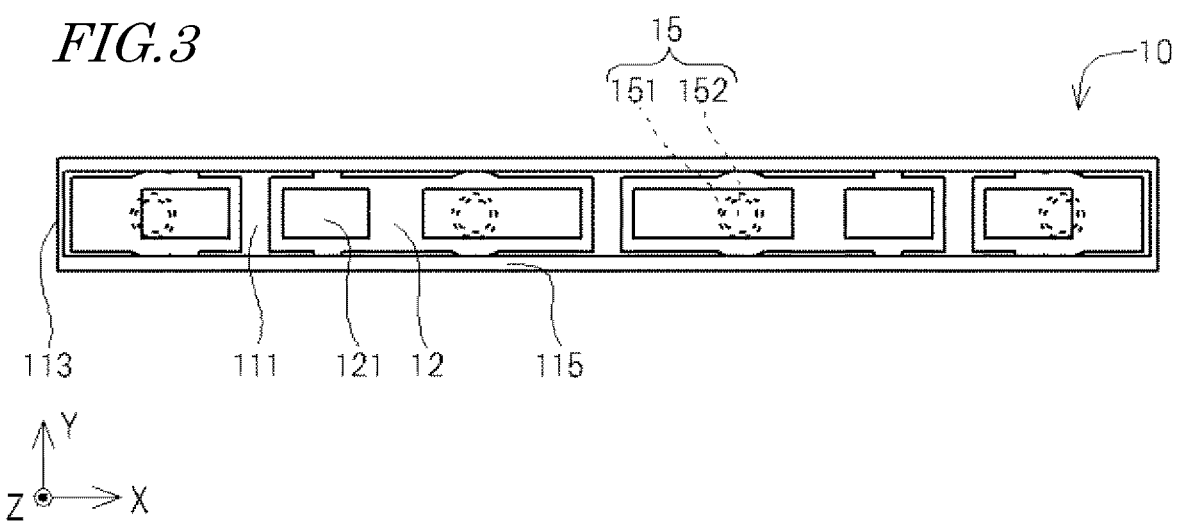
FIG. 3 is a schematic plan view of a substrate of the light emitting device in the first embodiment of the present disclosure.
Figure 4:
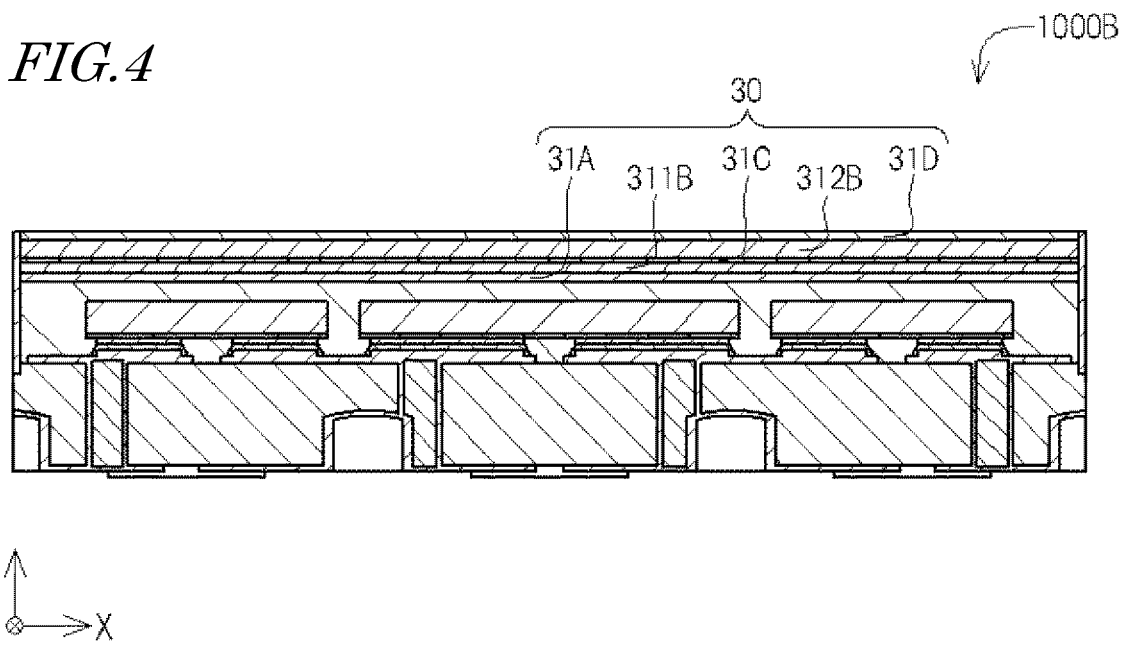
FIG. 4 is a schematic cross-sectional view of a light emitting device in a variant example of the first embodiment of the present disclosure.

As shown in FIG. 3, the recess 115 of the base member 11 is located along the outer peripheral surface of the base member 11. That is, the base member 11 has a thickness at the outer peripheral surface thereof smaller than a thickness of a portion the base member 11 where the first emitting element 20A and the second light emitting element 20B are located. The "thickness of the base member 11" refers to a thickness of the base member 11 in a Z direction. The recess 115 may be formed by blade dicing, laser dicing or the like.

It is preferable that the recess 115 has a depth in the Z direction of 5 μm or greater and 80 μm or less. With the depth of the recess 115 of 5 μm or greater, the contact area between the base member 11 and the first reflective member 40 can be increased. With the depth of the recess 115 of 80 μm or less, strength of the base member 11 can be increased.

It is preferable that the recess 115 has a width of 10 μm or greater and 50 μm or less. With the width of the recess 115 of 10 μm or greater, the contact area between the base member 11 and the first reflective member 40 can be increased. With the width of the recess 115 of 50 μm or less, the strength of the base member 11 can be increased. In this specification, the "width of the recess 115" refers to the shortest distance between an inner peripheral surface defining the recess 115 and the outer peripheral surface of the base member 11 in a plan view. It is preferable that the recess 115 has a uniform width in an X direction in a portion thereof corresponding to the first light emitting element 20A and/or the second light emitting element 20B. It is preferable that the recess 115 has a uniform width in a Y direction in a portion thereof corresponding to the first light emitting element 20A and/or the second light emitting element 20B. With such a structure, the first reflective member 40 is designed easily to be thin in the X direction and/or the Y direction, and thus the size of the light emitting device can be decreased. In this specification, the "width of the first reflective member 40" refers to the shortest distance between each of inner lateral surfaces 411 and a respective one of the outer lateral surfaces 412 of the first reflective member 40 in a plan view.

The light emitting device 1000A includes the first light emitting element 20A having an emission peak wavelength of 430 nm or greater and less than 490 nm (i.e., wavelength range of blue light) and the second light emitting element 20B having an emission peak wavelength of 490 nm or greater and 570 nm or less (i.e., wavelength range of green light). This allows the light emitting device 1000A to have an increased color rendering properties. As shown in FIG. 2B, the light emitting device 1000A may include a third light emitting element 20C, in addition to the first light emitting element 20A and the second light emitting element 20B, for example.

In the case where the first light emitting element 20A, the second light emitting element 20B and the third light emitting element 20C are arranged in this order in the X direction, it is preferable that the first light emitting element 20A and the third light emitting element 20C have an equal emission peak wavelength. With such an arrangement, even in the case where, for example, the output of the first light emitting element 20A is insufficient, such an insufficiency is compensated for by the third light emitting element 20C. The second light emitting element 20B, having an emission peak wavelength different from the emission peak wavelength of the first light emitting element 20A and from the emission peak wavelength of the third light emitting element 20C, may be located between the first light emitting element 20A and the third light emitting element 20C. With such a structure, color rendering properties of the light emitting device 1000A can be increased, and also unevenness in emission color of the light emitting device 1000A can be reduced compared to the case where the first light emitting element 20A, the third light emitting element 20C and the second light emitting element 20B are arranged in this order. In the case where the second light emitting element 20B, the first light emitting element 20A and the third light emitting element 20C are arranged in this order in the X direction, it is preferable that the second light emitting element 20B and the third light emitting element 20C have an equal emission peak wavelength. With such an arrangement, even in the case where, for example, the output of the second light emitting element 20B is insufficient, such an insufficiency is compensated for by the third light emitting element 20C. In this specification, the expression that "equal emission peak wavelength" allows a tolerance of about ±10 μm.

The first light emitting element 20A includes a first light extraction surface 201A, a first electrode formation surface 203A located opposite to the first light extraction surface 201A, first lateral surfaces 202A located between the first light extraction surface 201A and the first electrode formation surface 203A, and a plurality of first electrodes 21A and 22A formed on the first electrode formation surface 203A. The first light emitting element 20A includes a first semiconductor stack body 23A, and the first semiconductor stack body 23A is provided with the plurality of first electrodes 21A and 22A. The first light emitting element 20A includes a first element substrate 24A in the first embodiment, but may not include the first element substrate 24A. As in the first light emitting element 20A, the second light emitting element 20B includes an element light extraction surface 201B, an element electrode formation surface 203B, a second lateral surface 202B, and a plurality of second electrodes 21B and 22B. The second light emitting element 20B includes a second semiconductor stack body 23B. The second light emitting element 20B includes a second element substrate 24B in the first embodiment, but may not include the second element substrate 24B. As in the first light emitting element 20A, the third light emitting element 20C includes a third light extraction surface 201C, a third electrode formation surface 203C, a third lateral surface 202C, and a plurality of third electrodes. The third light emitting element 20C includes a third semiconductor stack body. The third light emitting element 20C includes a third element substrate in the first embodiment, but may not include the third element substrate.

The first light extraction surface 201A may be referred to as a "upper surface of the first light emitting element 20A". The second light extraction surface 201B may be referred to as a "upper surface of the second light emitting element 20B". The third light extraction surface 201C may be referred to as a "upper surface of the third light emitting element 20C". The first electrode formation surface 203A may be referred to as a "lower surface of the first light emitting element 20A". The second electrode formation surface 203B may be referred to as a "lower surface of the second light emitting element 20B". The third electrode formation surface 203C may be referred to as a "lower surface of the third light emitting element 20C". The first light emitting element 20A, the second light emitting element 20B and/or the third light emitting element 20C may be collectively referred to as a "light emitting element 20".

Figure 2A:
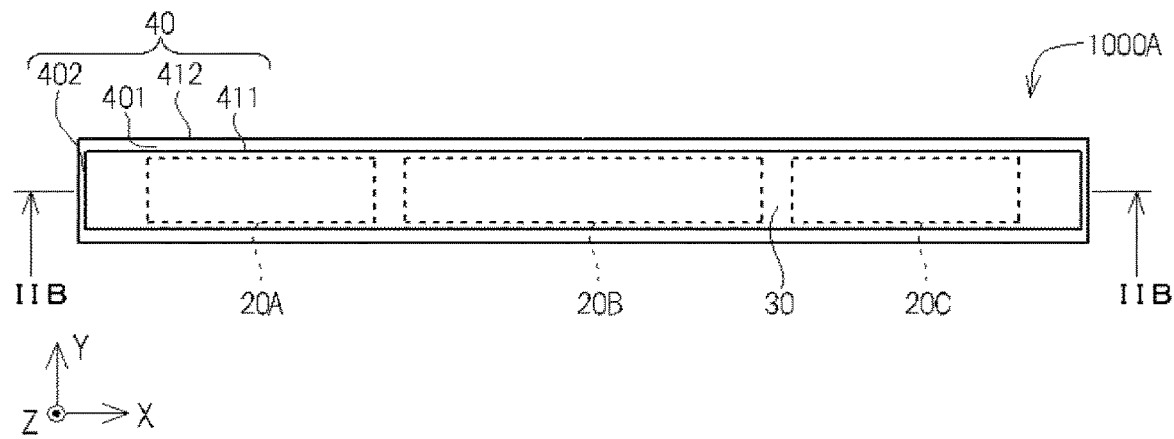
FIG. 2A is a schematic plan view of the light emitting device in the first embodiment of the present disclosure.
Figure 2B:
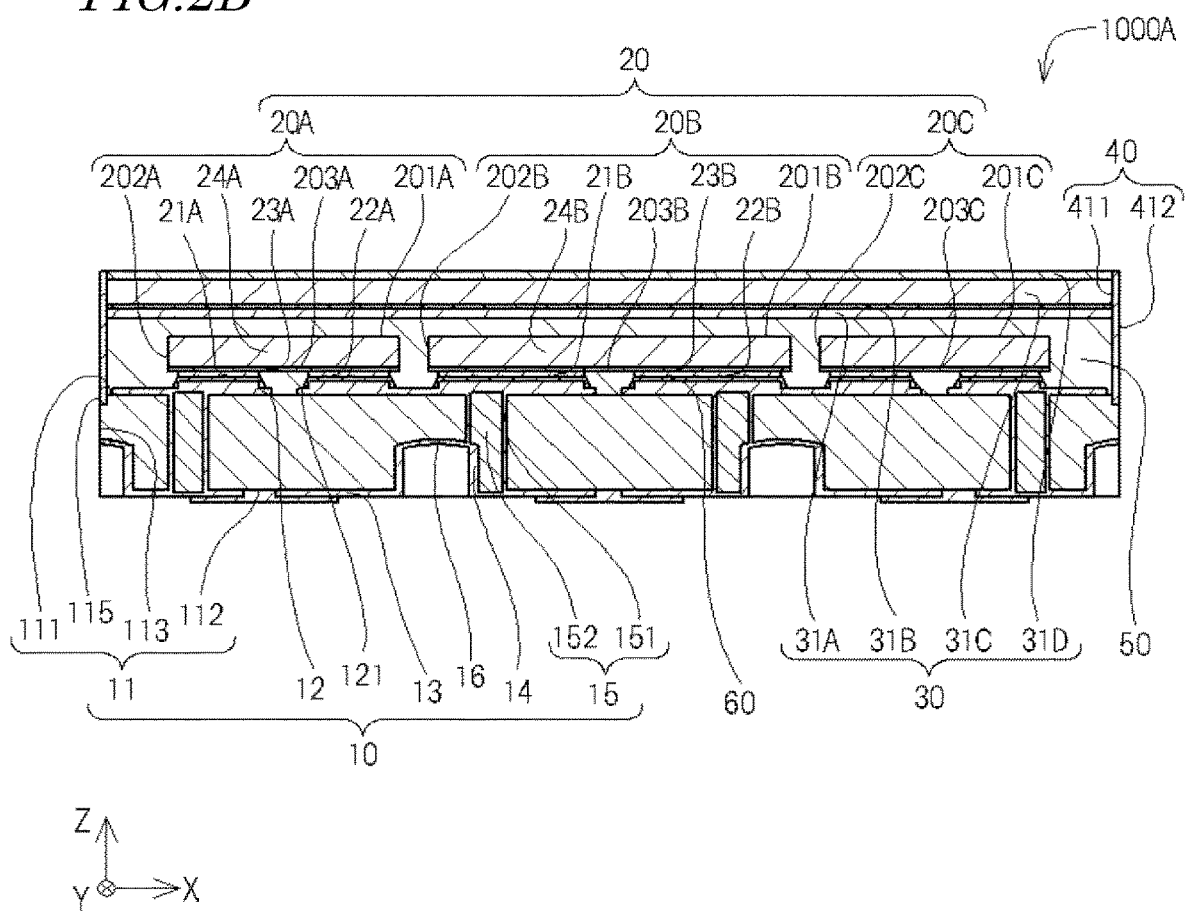
FIG. 2B is a schematic cross-sectional view taken along line IIB-IIB in FIG. 2A.

As shown in FIG. 2A, in the case where the first light extraction surface 201A and the second light extraction surface 201B are rectangular in a plan view, it is preferable that a shorter side of the first light extraction surface 201A and a shorter side of the second light extraction surface 201B face each other. Such a structure allows for reducing a thickness of the light emitting device 1000A in the Y direction. In the case where each of the second light extraction surface 201B and the third light extraction surface 201C has a rectangular shape, it is preferable that a shorter side of the second light extraction surface 201B and a shorter side of the third light extraction surface 201C face each other. Such a structure allows for reducing the thickness of the light emitting device 1000A in the Y direction.

As shown in FIG. 2B, it is preferable that first wiring portion 12 corresponding to the first light emitting element 20A includes protruding portions 121 located at positions corresponding to the plurality of first electrodes 21A and 22A of the first light emitting element 20A. In other words, it is preferable that the first wiring portion 12 includes the protruding portions 121 overlapping the plurality of first electrodes 21A and 22A in a plan view. With the first wiring portion 12 including the protruding portions 121, when the first wiring portion 12 is connected with the first electrodes 21A and 22A via a conductive bonding member 60, alignment between the first light emitting element 20A and the substrate 10 can be performed easily by a self-alignment effect. It is preferable that the protruding portions 121 have a thickness in the Z direction of 10 μm or greater and 30 μm or less. In the case where the light emitting device 1000A includes the second light emitting element 20B and/or the third light emitting element 20C, similarly, it is preferable that respective corresponding first wiring portion 12 includes the protruding portions 121 located at positions corresponding to the plurality of second electrodes 21B and 22B and/or the plurality of third electrodes. Such a structure allows alignment between the second light emitting element 20B and/or the third light emitting element 20C and the substrate 10 can be performed easily by a self-alignment effect. A width of each of the protruding portions 121 in the X direction and/or the Y direction may be appropriately changed in accordance with the size of the electrodes facing the protruding portions 121. For example, in the X direction, a width of each of the protruding portions 121 corresponding to the first electrodes 21A and 22A of the first light emitting element 20A may be less than a width of each of the protruding portions 121 corresponding to the second electrodes 21B and 22B of the second light emitting element 20B.

The light guide member 50 covers the first light emitting element 20A, the second light emitting element 20B and the upper surface 111 of the base member 11. The first light emitting element 20A and the second light emitting element 20B are covered with the light guide member 50, and thus are protected against an external stress. In the case where the light emitting device 1000A includes the third light emitting element 20C, the light guide member 50 covers the third light emitting element 20C. It is preferable that the light guide member 50 covers the upper surface and lateral surfaces of the light emitting element 20. The light guide member 50 has a transmittance higher than that of the first reflective member 40 to light from the light emitting element 20. Therefore, the light guide member 50 covering the upper surface and the lateral surface of the light emitting element 20 allows the light from the light emitting element 20 to be easily extracted to the outside of the light emitting device 1000A via the light guide member 50. This allows for improving the light extraction efficiency of the light emitting device 1000A.

The light guide member 50 may include a wavelength conversion member. Such a structure allows for facilitating adjustment of emission color of the light emitting device 1000A. The wavelength conversion member is adapted to absorb at least a part of primary light emitted by the light emitting element 20 and to emit secondary light having a wavelength different from the wavelength of the primary light. The wavelength conversion member may be uniformly dispersed in the light guide member 50, or may be disposed more densely in the vicinity of the base member 11 than in the vicinity of an upper surface of the light guide member 50.

The wavelength conversion member included in the light guide member 50 may be, for example, a wavelength conversion member having an emission peak wavelength in a range of 490 nm to 570 nm and adapted to emit green light, a wavelength conversion member having an emission peak wavelength in a range of 610 nm to 750 nm and adapted to emit red light, or the like. The light guide member 50 may include one type of, or a plurality types of, wavelength conversion member. For example, a wavelength conversion member adapted to emit green light and a wavelength conversion member adapted to red light may be included in the light guide member 50. An example of the wavelength conversion member adapted to emit green light is a β-SiAlON-based phosphor (e.g., $Si_{6-z}Al_zO_zN_{8-z}$: Eu (0<z<4.2)). An example of the wavelength conversion member adapted to emit red light is a manganese-activated potassium fluorosilicate phosphor (e.g., $K_2SiF_6$: Mn).

It is preferable that the light emitting device 1000A includes a light-transmissive member 30 covering the upper surface of the first light emitting element 20A and the upper surface of the second light emitting element 20B, with the light guide member 50 being located between the light-transmissive member 30 and the upper surfaces of the first light emitting element 20A and the second light emitting element 20B. The upper surfaces of the first light emitting element 20A and the second light emitting element 20B are covered with the light-transmissive member 30, so that the first light emitting element 20A and the second light emitting element 20B are protected against an external stress. In the case where the light emitting device 1000A includes the third light emitting element 20C, the light-transmissive member 30 covers the upper surface of the third light emitting element 20C, with the light guide member 50 being located between the light-transmissive member 30 and the upper surface of the third light emitting element 20C. In the case where the light emitting device 1000A includes the light-transmissive member 30, it is preferable that lateral surfaces of the light-transmissive member 30 is covered with the first reflective member 40. With such a structure, the light emitting device 1000A can have a high contrast between a light emitting region and a non-light emitting region, namely, can have a high "visibility".

The light-transmissive member 30 may include a wavelength conversion member. Such a structure allows for facilitating adjustment of emission color of the light emitting device 1000A. It is preferable that the wavelength conversion member included in the light-transmissive member 30 has an emission peak wavelength in a range of 610 nm to 750 nm (i.e., wavelength range of red light). With the emission peak wavelength of the first light emitting element 20A in the wavelength range of blue light and the emission peak wavelength of the second light emitting element 20B in the wavelength range of green light, the color rendering properties of the light emitting device 1000A can be increased when the emission peak wavelength of the wavelength conversion member included in the light-transmissive member 30 is in the wavelength range of red light. The light-transmissive member 30 may include one type of, or a plurality types of, wavelength conversion member. For example, a wavelength conversion member adapted to emit green light and a wavelength conversion member adapted to emit red light may be included in the light-transmissive member 30. With the light-transmissive member 30 including a wavelength conversion member adapted to emit green light, adjustment of emission color of the light emitting device 1000A can be facilitated. An example of the wavelength conversion member outputting green light is a β-SiAlON-based phosphor (e.g., $Si_{6-z}Al_zO_zN_{8-z}$: Eu (0<z<4.2)). An example of the wavelength conversion member adapted to emit red light is a manganese-activated potassium fluorosilicate phosphor (e.g., $K_2SiF_6$: Mn).

The wavelength conversion member may be uniformly dispersed in the light-transmissive member 30, or may be disposed more densely in the vicinity of the light emitting element 20 than in the vicinity of an upper surface of the light-transmissive member 30. With the wavelength conversion member disposed more densely in the vicinity of the light emitting element 20 than in the vicinity of the upper surface of the light-transmissive member 30, a base material of the light-transmissive member 30 may serve as a protective layer. Therefore, even if the wavelength conversion member is weak against moisture, deterioration of the wavelength conversion member can be reduced.

Alternatively, the light-transmissive member 30 may include a layer containing a wavelength conversion member and a layer containing substantially no wavelength conversion member. In the Z direction, the layer containing substantially no wavelength conversion member is located upward of the layer containing a wavelength conversion member. With such a structure, the layer containing substantially no wavelength conversion member serves as a protective layer, and thus deterioration of the wavelength conversion member can be reduced. An example of the wavelength conversion member weak against moisture is a manganese-activated potassium fluorosilicate phosphor. The manganese-activated potassium fluorosilicate phosphor is adapted to emit light having a relatively narrow spectral band width, which is preferable in view of color reproducibility. The expression "containing substantially no wavelength conversion member" indicates that the layer may contain a wavelength conversion member that is unavoidably mixed into the layer. It is preferable that a content of the wavelength conversion member in "the layer containing substantially no wavelength conversion member" is 0.05% by weight or less.

As shown in FIG. 2B, it is preferable that the light-transmissive member 30 includes a first diffusive layer 31A, a light-transmissive layer 31B disposed on the first diffusive layer 31A, a wavelength conversion layer 31C disposed on the light-transmissive layer 31B, and a second diffusive layer 31D disposed on the wavelength conversion layer 31C. The first diffusive layer 31A contains a base material and a diffusive member. The light-transmissive layer 31B contains a base material, and contains substantially no wavelength conversion member and substantially no diffusive member. The wavelength conversion layer 31C contains a base material and a wavelength conversion member. The second diffusive layer 31D includes abase material and a diffusive member. The expression "contains substantially no wavelength conversion member and substantially no diffusion member" indicates that the layer may contain a wavelength conversion member and/or a diffusive member that are unavoidably mixed into the layer.

It is preferable that a content of each of the wavelength conversion member and the diffusive member in "the layer containing substantially no wavelength conversion member and substantially no diffusion member" is 0.05% by weight or lower.

For the base materials of the first diffusive layer 31A, the light-transmissive layer 31B, the wavelength conversion layer 31C and the second diffusive layer 31D, materials different from each other or the same material may be used. Using the same material for the base materials of the first diffusive layer 31A, the light-transmissive layer 31B, the wavelength conversion layer 31C and the second diffusive layer 31D allows for increasing the joining strength thereof. Examples of a material used for the base materials of the first diffusive layer 31A, the light-transmissive layer 31B, the wavelength conversion layer 31C and the second diffusive layer 31D include a silicone resin.

With the light-transmissive member 30 including the first diffusive layer 31A and the second diffusive layer 31D, light emitted from the first light emitting element 20A and light emitted from the second light emitting element 20B are diffused by the first diffusive layer 31A and the second diffusive layer 31D. This allows the light emitted from the first light emitting element 20A and the light emitted from the second light emitting element 20B to be mixed together in the light-transmissive member 30 and/or the light guide member 50. This allows for reducing unevenness in emission color of the light emitting device 1000A.

With the light-transmissive layer 31B located between the first diffusive layer 31A and the wavelength conversion layer 31C, detachment between the first diffusive layer 31A and the wavelength conversion layer 31C can be prevented. The light-transmissive layer 31B, which contains substantially no wavelength conversion member and substantially no diffusive member and is located between the first diffusive layer 31A and the wavelength conversion layer 31C, serves as an adhesive agent and thus allows for preventing detachment between the first diffusive layer 31A and the wavelength conversion layer 31C. The light-transmissive layer 31B may be located between the wavelength conversion layer 31C and the second diffusive layer 31D. The light-transmissive layer 31B located at such a position allows for preventing detachment between the wavelength conversion layer 31C and the second diffusive layer 31D.

The wavelength conversion layer 31C of the light-transmissive member 30 may be in a single layer or may have a layered structure. For example, as in the light emitting device 1000B shown in FIG. 4, the light-transmissive member 30 may include a first wavelength conversion layer 311B and a second wavelength conversion layer 312B covering the first wavelength conversion layer 311B. The second wavelength conversion layer 312B may directly cover the first wavelength conversion layer 311B, or may cover the first wavelength conversion layer 311B with a different layer such as a light-transmissive layer or like being located between the second wavelength conversion layer 312B and the first wavelength conversion layer 311B. The first wavelength conversion layer 311B is located closer to the upper surface of the first light emitting element 20A and the upper surface of the second light emitting element 20B than the second wavelength conversion layer 312B. It is preferable that the emission peak wavelength of the wavelength conversion member included in the first wavelength conversion layer 311B is less than the emission peak wavelength of the wavelength conversion member included in the second wavelength conversion layer 312B. With such an arrangement, light from the first wavelength conversion layer 311B, which is excited by light emitted from the first light emitting element 20A and/or the second light emitting element 20B, excites the wavelength conversion member included in the second wavelength conversion layer 312B. This allows for increasing the amount of the light from the wavelength conversion member included in the second wavelength conversion layer 312B.

It is preferable that the emission peak wavelength of the wavelength conversion member included in the first wavelength conversion layer 311B is in a range of 500 nm to 570 nm, and that the emission peak wavelength of the wavelength conversion member included in the second wavelength conversion layer 312B is in a range of 610 nm to 750 nm. Such an arrangement allows for increasing the color rendering properties of the light emitting device 1000B. Examples of the wavelength conversion member contained in the first wavelength conversion layer 311B include a β-SiAlON-based phosphor, and examples of the wavelength conversion member contained in the second wavelength conversion layer 312B include a manganese-activated potassium fluorosilicate phosphor. In the case where the light-transmissive member 30 includes the first wavelength conversion layer 311B and the second wavelength conversion layer 312B, it is particularly preferable that the manganese-activated potassium fluorosilicate phosphor is used to form the wavelength conversion member included in the second wavelength conversion layer 312B. Although the manganese-activated potassium fluorosilicate phosphor easily causes brightness saturation, the first wavelength conversion layer 311B disposed between the second wavelength conversion layer 312B and the light emitting element 20 allows for preventing excessive irradiation of light emitted from the light emitting element 20 toward the manganese-activated potassium fluorosilicate phosphor. This allows for reducing deterioration of the manganese-activated potassium fluorosilicate phosphor.

In the exemplary structure illustrated in FIG. 2A, the first reflective member 40 surrounds the upper surface of the base member 11 and the light guide member 50, the first reflective member 40 being ring-shaped in a plan view. With the first reflective member 40 surrounding the light guide member 50, light traveling in the X direction and/or the Y direction from the light emitting element 20 is reflected by the first reflective member 40, and thus the amount of light traveling in the Z direction can be increased. With the first reflective member 40 surrounding the upper surface of the base member 11, so that the upper surface of the base member 11 is exposed from the first reflective member 40. This allows for increasing the area of the light guide member 50 in a plan view. Therefore, the light extraction efficiency of the light emitting device can be improved. The first reflective member 40 is in contact with the light guide member 50. This allows for increasing the area of the light guide member 50 in a plan view, and thus improving the light extraction efficiency of the light emitting device.

The first reflective member 40 may be formed of a material containing a white pigment in a base material. It is preferable that the base material of the first reflective member 40 and the base material of the light-transmissive member 30 are formed of the same material. Such an arrangement allows for increasing the joining strength between the first reflective member 40 and the light-transmissive member 30. It is preferable that the base material of the first reflective member 40, the base material of the light-transmissive member 30 and a base material of the light guide member 50 are formed of the same material. Such an arrangement allows for increasing the joining strength between the first reflective member 40, the light-transmissive member 30 and the light guide member 50. With the base material of the first reflective member 40 and the base material of the light guide member 50 formed of the same material, joining strength between the first reflective member 40, the light guide member 50 and the substrate 10 can be increased.

As seen in a plan view, it is preferable that the first reflective member 40 has a width in a range of 10 μm to 50 μm. With the width of the first reflective member 40 of 50 μm or less, the size of the light emitting device can be decreased. With the width of the first reflective member 40 of 10 μm or greater, light emitted from the light emitting element 20 and transmitted through the first reflective member 40 can be reduced.

In a plan view, it is preferable that the first reflective member 40 and the recess 115 are of the same shape as each other. With such a structure, the first reflective member 40 with a reduced thickness in the X direction and/or the Y direction is easily designed, and thus a size of the light emitting device can be reduced. In the present specification, the expression "same shape" allows a tolerance of about ±5 μm.

The first reflective member 40 may be formed as described below. For example, after the light guide member 50 covering the first light emitting element 20A, the second light emitting element 20B and the upper surface 111 of the base member 11 is formed, a part of the base member 11 and a part of the light guide member 50 are removed by blade dicing to form a recess, and the recess formed by the removal is filled with the first reflective member 40.

In the case where the substrate 10 has an elongated rectangular shape in a plan view, the first reflective member 40 includes a first reflective portion 401 extending along a longer side of the substrate 10 and a second reflective portion 402 extending along a shorter side of the substrate 10. For example, the first reflective portion 401 and the second reflective portion 402 may have an equal width, or a width of the first reflective portion 401 is longer than a width of the second reflective portion 402. In the case where a width of the first reflective portion 401 is longer than a width of the second reflective portion 402, the strength of the first reflective portion 401 extending along the longer side can be increased.

Figure 5:
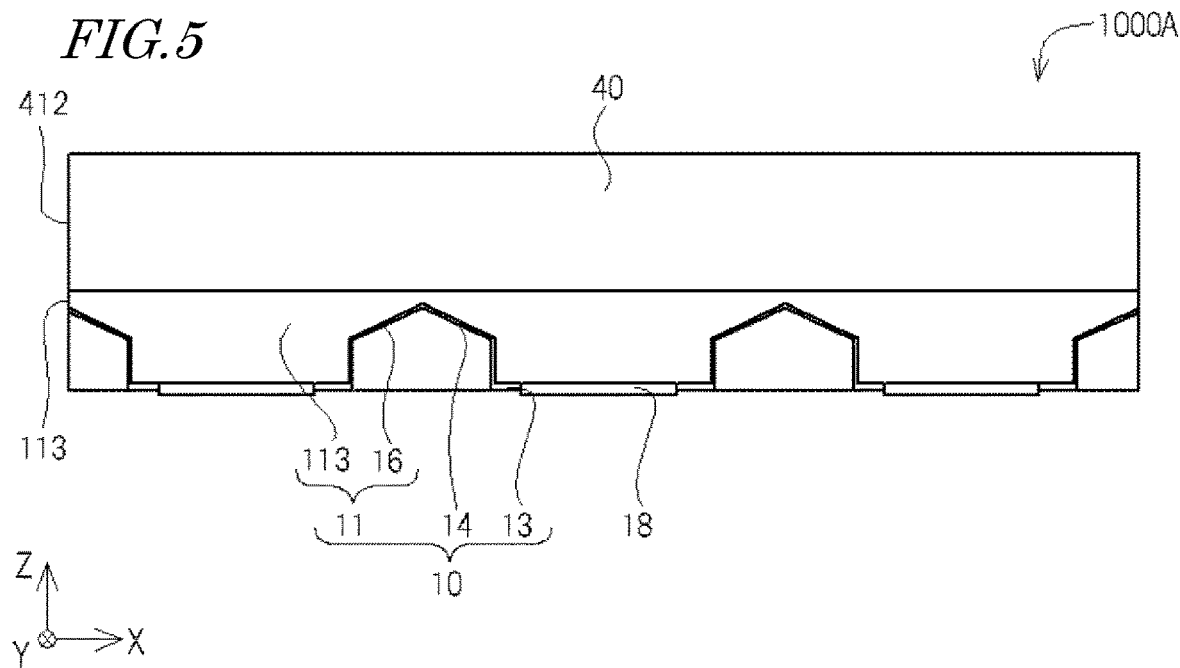
FIG. 5 is a schematic side view of the light emitting device in the first embodiment of the present disclosure.
Figure 6:
FIG. 6 is a schematic side view of the light emitting device in the first embodiment of the present disclosure.

At least a portion of each of the lateral surfaces 113 of the base member 11 and at least a portion of a respective one of the outer lateral surfaces 412 of the first reflective member 40 are in the same plane. Such a structure allows for reducing the size of the light emitting device. As shown in FIG. 5 and FIG. 6, in the case where the substrate 10 has a rectangular shape, it is preferable that each of the lateral surfaces 113 of the base member 11 and a respective one of the outer lateral surfaces 412 of the first reflective portion 401 are in the same plane, and that each of the lateral surfaces 113 of the base member 11 and a respective one of the outer lateral surfaces 412 of the second reflective portion 402 are in the same plane. Such a structure further decreases the size of the light emitting device.

Figure 7:
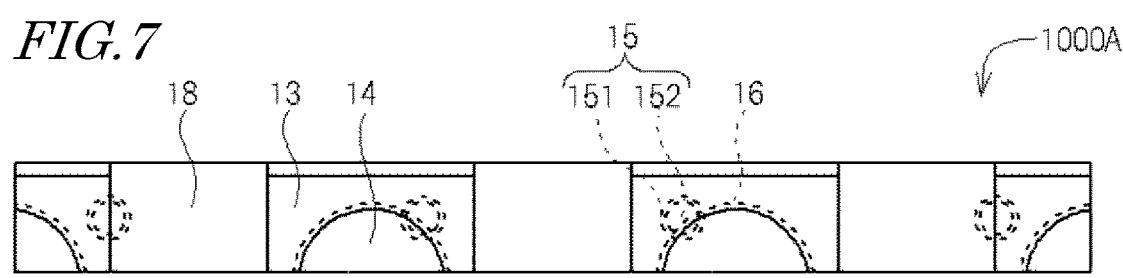
FIG. 7 is a schematic bottom view of the light emitting device in the first embodiment of the present disclosure.

In the case where the substrate 10 includes the vias 15, as shown in FIG. 7, it is preferable that each of the vias 15 has a circular shape in a bottom view. With such a shape, the vias 15 are easily formed by drilling or the like. In the case where each via 15 has a circular shape in a bottom view, it is preferable that each via 15 has a diameter of 100 µm or greater and 150 µm or less. With the diameter of each via 15 of 100 µm or greater, heat dissipation of the light emitting device 1000A can be improved. With the diameter of each via 15 is 150 µm or less, decrease in strength of the substrate 10 can be reduced. In the present specification, the expression "circular shape" encompasses a circle and also a shape close to a circle (e.g., an ellipse and a quadrangle with four corners greatly rounded).

The vias 15 may be formed of a conductive member filling through-holes formed in the base member 11. Alternatively, as shown in FIG. 2B, each via 15 may include a fourth wiring portion 151 covering an inner surface of the through-hole in the base member 11 and a filling member 152 filling a space surrounded by the fourth wiring portion 151. The filling member 152 may be conductive or insulating. It is preferable that a resin material is used for the filling member 152. In general, a resin material before has a higher fluidity than that of a molten metal, and therefore, easily fills the space surrounded by the fourth wiring portion 151. Such use of a resin material for the filling member 152 allows for facilitating forming of the substrate 10.

Examples of a resin material that easily fills the space surrounded by the fourth wiring portion 151 include an epoxy resin. In the case where a resin material is used for the filling member 152, the resin material preferably contain an additive in order to reduce the coefficient of linear thermal expansion of the filling member 152. Such an arrangement allows for reducing the difference between of the filling member 152 and the coefficient of linear thermal expansion the fourth wiring portion 151, and thus creation of a gap between the fourth wiring portion 151 and the filling member 152 due to the heat from the light emitting element 20 can be prevented. For the additive to be contained in the filling member 152, for example, silicon oxide can be used. In the case where a metal material is used for the filling member 152, heat dissipation can be improved. In the case where the vias 15 are formed of a conductive material filling the through-hole formed in the base member 11, it is preferable that a metal material having a high heat conductivity such as Ag or Cu is used for the conductive material.

The substrate 10 may define one or more recessed portions 16 opened at the lower surface and one or more lateral surfaces of the base member 11. With the plurality of recessed portions 16, the joining strength between the light emitting device 1000A and a mounting substrate can be increased. The light emitting device 1000A may be of a top view type, in which the lower surface 112 of the base member 11 and the mounting substrate face each other, or of a side view type, in which one of the lateral surfaces 113 of the base member 11 and the mounting substrate face each other. In both a top view type light emitting device 1000A and a side-view type light emitting device 1000A, increase in the volume of a joining member allows for increasing joining strength between the light emitting device 1000A and the mounting substrate. The joining strength between the light emitting device 1000A and the mounting substrate can be increased especially with the side view type. In the case where the substrate 10 has a rectangular shape, the recessed portions 16 of the base member 11 may overlap the recess 115 on the shorter side of the base member 11 as seen in a plan view.

It is preferable that each of the recessed portions 16 has a maximum depth in the Z direction that is 0.4 to 0.9 times the thickness of the base member 11 in the Z direction. With the depth of the recessed portions 16 greater than 0.4 times the thickness of the base member 11, the volume of the joining member formed in the recessed portions 16 is increased. This allows for increasing the joining strength between the light emitting device and the mounting substrate. With the depth of the recessed portions 16 less than 0.9 times the thickness of the base member 11, decrease in the strength of the base member 11 can be reduced.

The light emitting device 1000A may include insulating films 18 each covering parts of corresponding ones of the second wiring portions 13. With the insulating films 18, insulation at a lower surface of the light emitting device 1000A can be ensured, and short-circuiting of the light emitting device 1000A can be prevented. The insulating films 18 can also prevent detachment of the second wiring portions 13 from the base member 11.

Figure 8:
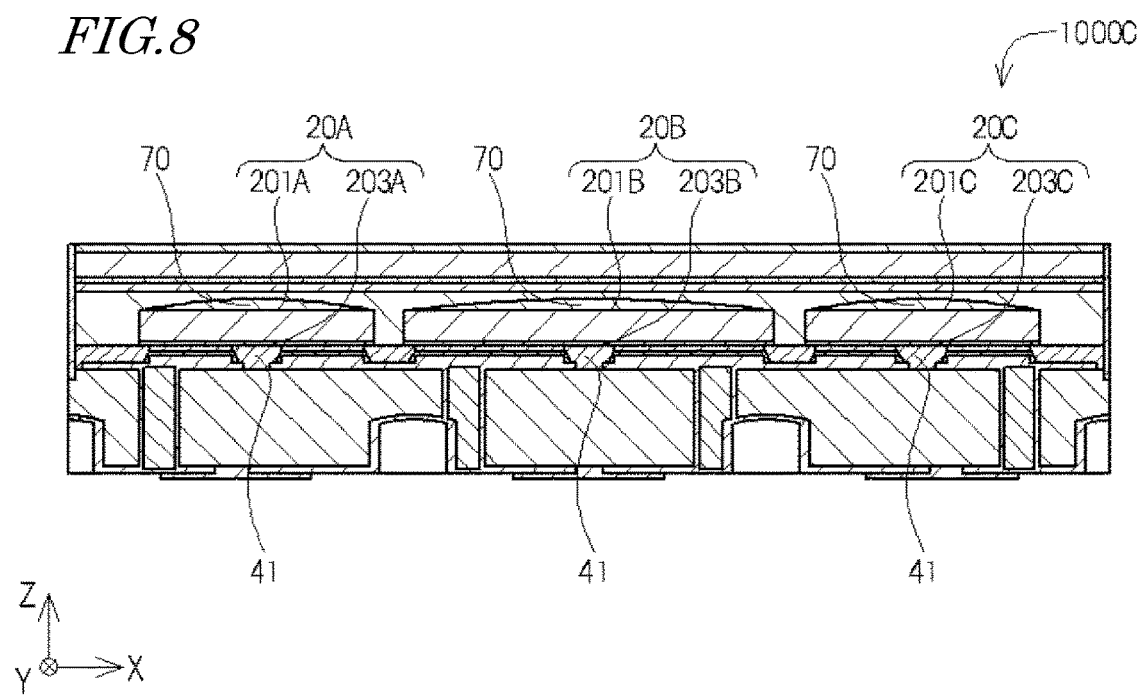
FIG. 8 is another schematic cross-sectional view of a light emitting device in a variant example of the first embodiment of the present disclosure.
Figure 9:
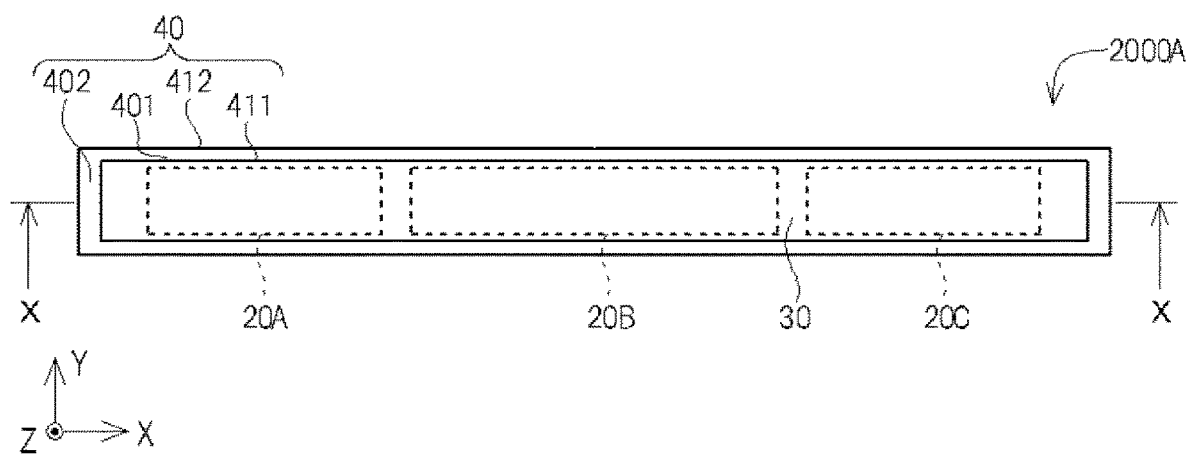
FIG. 9 is a schematic plan view of a light emitting device in a second embodiment of the present disclosure.

As in the light emitting device 1000C shown in FIG. 8, a second reflective member 41 may be provided on the substrate 10. In the exemplary construction illustrated in FIG. 8, a portion of the second reflective member 41 is disposed between the substrate 10 and the lower surface of the first light emitting element 20A. With the second reflective member 41, absorption of light emitted from the first light emitting element 20A by the substrate 10 can be reduced. This allows for improving the light extraction efficiency of the light emitting device 1000C. The second reflective member 41 may include a portion located between the substrate 10 and the lower surface of the second light emitting element 20B. It is preferable that the second reflective member 41 is in contact with the first reflective member 40. Such a structure allows for reducing absorption of light emitted from the light emitting element 20 by the substrate 10. The second reflective member 41 covers lateral surfaces of the protruding portions 121 of the first wiring portions 12. It is preferable that an upper surface of the second reflective member 41 is located between the lower surface and the upper surface of the light emitting element 20. With the upper surface of the second reflective member 41 located above the lower surface of the light emitting element 20, absorption of light emitted from the light emitting element 20 by the electrodes of the light emitting element 20 can be reduced. With the upper surface of the second reflective member 41 located below the upper surface of the light emitting element 20, light emitted from lateral surfaces of the light emitting element 20 is easily extracted. This allows for improving the light extraction efficiency of the light emitting device 1000C. The second reflective member 41 may be formed of a material substantially the same as that of the first reflective member 40. The base material of the first reflective member 40 and a base material of the second reflective member 41 are preferably formed of the same material. Such an arrangement allows for increasing the joining strength between the first reflective member 40 and the second reflective member 41.

As in the light emitting device 1000C shown in FIG. 8, a light emitting device according to the first embodiment may include a cover member 70 covering the upper surface of the first light emitting element 20A, the upper surface of the second light emitting element 20B and/or the upper surface of the third light emitting element 20C. For example, the cover member 70 may contain a diffusive member. Such a structure allows for reducing the amount of the light traveling in the Z direction from the light emitting element 20 and increasing the amount of the light traveling in the X direction and/or the Y direction. Therefore, light emitted from the light emitting element 20 can be diffused in the light guide member 50, and thus unevenness in luminance of the light emitting device 1000C can be reduced. The cover member 70 is located between the upper surface of the light emitting element 20 and the light guide member 50. It is preferable that at least a portion of the lateral surface of the light emitting element 20 is exposed from the cover member 70. Such a structure allows for preventing reduction in the amount of the light traveling in the X direction and/or the Y direction from the light emitting element 20.

The cover member 70 may contain a wavelength conversion member. Such a structure allows for facilitating adjustment of emission color of the light emitting device 1000C. The wavelength conversion member contained in the cover member 70 may be of the same material as, or of a material different from a material of the wavelength conversion member contained in the wavelength conversion layer 31C. In the case where, for example, the emission peak wavelength of the light emitting element 20 is in the range of 490 nm to 570 nm (i.e., wavelength range of green light), it is preferable that the wavelength conversion member contained in the cover member 70 is formed of a CASN-based phosphor and/or a SCASN-based phosphor adapted to be excited by light in the wavelength range of 490 nm to 570 nm. Alternatively, the wavelength conversion member contained in the cover member 70 may be formed of a (Sr, Ca)$LiAl_3N_4$: EU phosphor.

Second Embodiment

Light emitting devices 2000A and 2000B according to a second embodiment of the present disclosure will be described with reference to FIG. 9 through FIG. 12. The light emitting device 2000A is different from the light emitting device 1000A in the first embodiment in the recessed portions of in the base member 11, the vias and the first reflective member. The light emitting device 2000B is different from the light emitting device 1000A in the first embodiment in the recessed portions of the base member 11, the vias, the first reflective member, and the number of light emitting elements.

Figure 10:
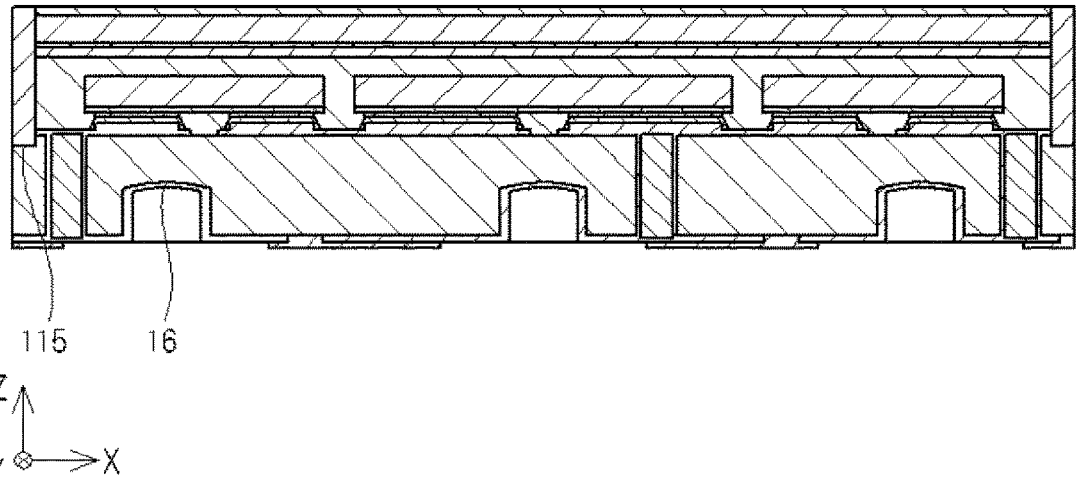
FIG. 10 is a schematic cross-sectional view taken along line X-X in FIG. 9.
Figure 11:
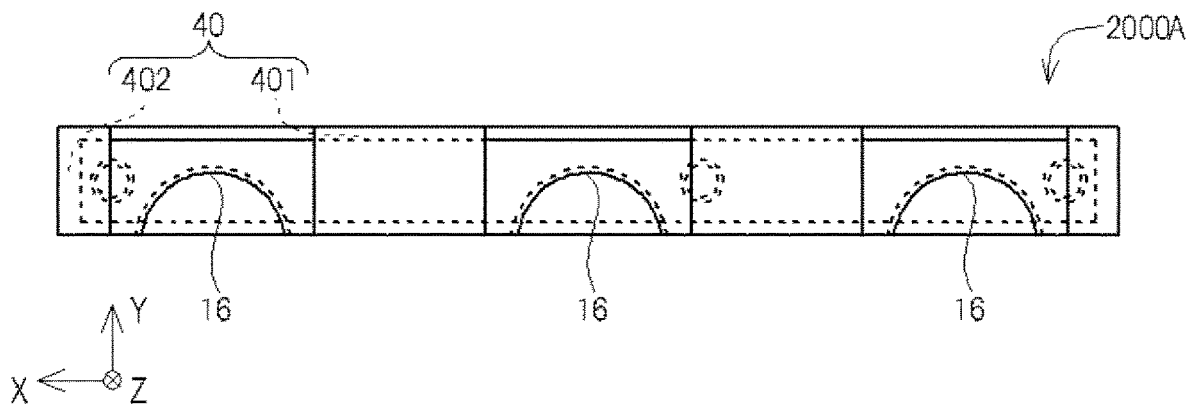
FIG. 11 is a schematic bottom view of the light emitting device in the second embodiment of the present disclosure.

As shown in FIG. 10 and FIG. 11, in the case where the substrate has a rectangular shape in a plan view, the recessed portions 16 of the base member may be spaced apart from the recess 115 on the shorter side of the base member in a plan view. With the recess 115 on the shorter side of the base member and the recessed portions 16 of the base member spaced apart from each other, a portion of the base member with a smaller thickness in the Z direction can be reduced. This allows for increasing the strength of the base member. In the case where the base member has a rectangular shape in a plan view, the first reflective member 40 includes the first reflective portion 401 extending along the longer side of the base member 11 and the second reflective portion 402 extending along the shorter side of the base member 11. In the case where the recess 115 extending along the shorter side of the base member and the recessed portions 16 of the base member 11 are separated from each other, the second reflective portion 402 and the recessed portions 16 of the base member are spaced apart from each other in a plan view. The second reflective portion 402 may have a width greater than a width of the first reflective portion 401.

Figure 12:
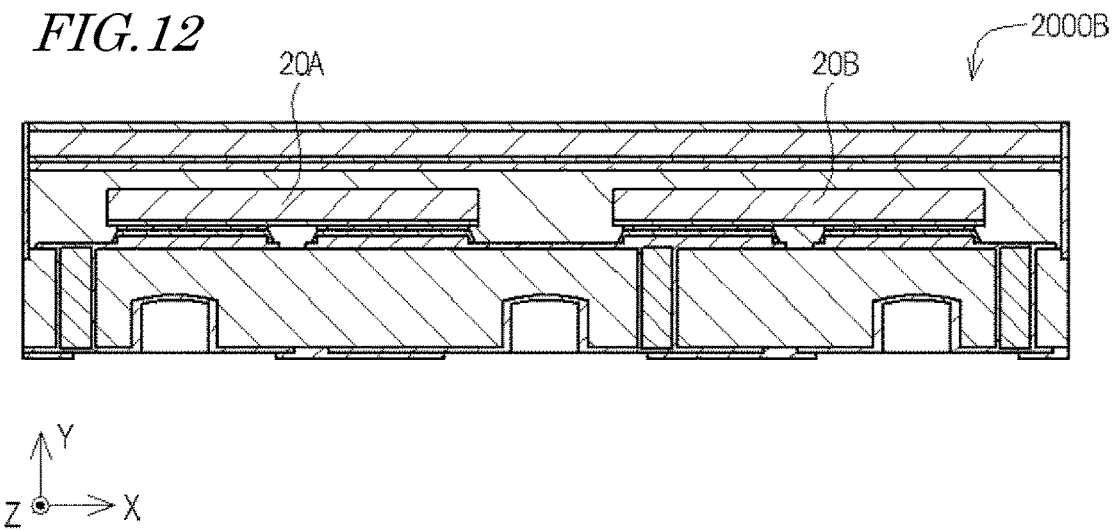
FIG. 12 is a schematic cross-sectional view of a light emitting device in a variant example of the second embodiment of the present disclosure.

The light emitting device according to certain embodiments may include any appropriate number of the light emitting elements. As shown in FIG. 12, the light emitting device 2000B may include two light emitting elements, namely, the first light emitting element 20A and the second light emitting element 20B. The light emitting device 2000B including two light emitting elements, namely, the first light emitting element 20A and the second light emitting element 20B, can achieve reduction in size.

Hereinafter, components of a light emitting device according to certain embodiments of the present disclosure will be described.

Substrate 10

The substrate 10 is a component on which the light emitting element 20 is placed. The substrate 10 includes the base member 11 and the first wiring portions 12. The base member 11 defines the recess opened at the upper surface and the lateral surfaces of the base member 11 and surrounding the outer perimeter of the upper surface of the base member 11. The substrate 10 may further include the recessed portions 16, the second wiring portions 13, the third wiring portions 14, and the vias 15.

Base Member 11

For the base member 11, an insulating material such as a resin, a fiber-reinforced resin (e.g., glass epoxy resin), a ceramic material, glass or the like can be used. For the resin or a fiber-reinforced resin, epoxy resin, glass-epoxy resin bismaleimide triazine (BT) resin, polyimide resin, or the like can be used. The base member 11 may contain a white pigment such as titanium oxide or the like. Examples of the ceramic material include aluminum oxide, aluminum nitride, zirconium oxide, zirconium nitride, titanium oxide, titanium nitride, a mixture thereof, and the like. Among these materials, it is especially preferable to use a material having a coefficient of linear thermal expansion close to that of the light emitting element 20. The base member 11 may have any appropriate thickness. In view of the strength of the base member 11, the base member 11 preferably has a thickness of 0.05 mm or greater, and is more preferably 0.2 mm or greater. In view of the thickness (i.e., depth in the Z direction) of the light emitting device, the thickness of the base member 11 is preferably 0.5 mm or less, and more preferably 0.4 mm or less.

First Wiring Portions 12

The first wiring portions 12 are disposed on the upper surface of the base member 11, and is electrically connected with at least one light emitting element. The first wiring portions 12 may be made of material comprising copper, iron, nickel, tungsten, chromium, aluminum, silver, gold, titanium, palladium, rhodium, or an alloy thereof. The first wiring portions 12 may be in a single layer or has a layered structure of the metal materials described above and alloys thereof. In view of, especially, heat dissipation, it is preferable to use copper or a copper alloy. The first wiring portions 12 may include a surface layer of, for example, silver, platinum, aluminum, rhodium, gold or an alloy thereof in view of, for example, wettability on the conductive bonding member 60 and/or light reflectance.

Second Wiring Portion 13, Third Wiring Portion 14

The second wiring portions 13 are disposed on the lower surface of the base member 11. Each of the third wiring portions 14 covers the inner wall defining a respective one of the recessed portions 16 and is electrically connected with the a corresponding one of the second wiring portions 13. The second wiring portions 13 and the third wiring portions 14 may be made of a conductive material substantially the same as that of the first wiring portions 12.

Via 15

The vias 15 are provided in the through-hole extending from the upper surface to the lower surface of the base member 11, and each via 15 electrically connects a corresponding one of the first wiring portions 12 and a corresponding one of the second wiring portions 13 to each other. Each via 15 may include the fourth wiring portion 151 covering the inner surface of the through-hole in the base member 11 and the filling member 152 filling a space defined by the fourth wiring portion 151. The fourth wiring portion 151 may be made of a conductive material that is the same as or similar to that of the first wiring portions 12, the second wiring portions 13, and the third wiring portions 14. For the filling member 152, a conductive material or an insulating material may be used.

Insulating Film 18

The insulating film 18 ensures insulation at the lower surface of the light emitting device and prevention of short-circuiting of the light emitting device. The insulating film 18 may be formed of a material that is used in the field. Examples of a material of the insulating film 18 include a thermosetting resin, a thermoplastic resin, and the like.

First Light Emitting Element 20A, Second Light Emitting Element 20B and Third Light Emitting Element 20C Each of the first light emitting element 20A, the second light emitting element 20B and the third light emitting element 20C is a semiconductor element configured to emit light when a voltage is applied, and may be a known semiconductor element formed of a nitride semiconductor, etc. Each of the first light emitting element 20A, the second light emitting element 20B and the third light emitting element 20C may be, for example, an LED chip. Each of the first light emitting element 20A, the second light emitting element 20B and the third light emitting element 20C includes a semiconductor stack body, and may further include an element substrate (i.e., the first element substrate 24A, a second element substrate 24B, or the third element substrate). It is preferable that each of the first light emitting element 20A, the second light emitting element 20B and the third light emitting element 20C has a quadrangular shape, more specifically, a square shape or an elongated rectangular shape longer in one direction, in a plan view. Alternatively, the first light emitting element 20A, the second light emitting element 20B and the third light emitting element 20C may have other shapes, for example, a hexagonal shape in a plan view. In the case where each of the first light emitting element 20A, the second light emitting element 20B, and the third light emitting element 20C has a hexagonal shape, the light emission efficiency can be improved. The lateral surfaces of each of the first light emitting element 20A, the second light emitting element 20B, and the third light emitting element 20C may be perpendicular to the upper surface of a respective one of the light emitting elements 20A, 20B, and 20C, or inclined inward or outward with respect to the direction perpendicular to the upper surface of a respective one of the light emitting elements 20A, 20B, and 20C. Each of the first light emitting element 20A, the second light emitting element 20B and the third light emitting element 20C includes positive and negative electrodes. The positive and negative electrodes may be made of gold, silver, tin, platinum, rhodium, titanium, aluminum, tungsten, palladium, nickel or an alloy thereof.

The emission peak wavelength of the first light emitting element 20A is 430 nm or greater and less than 490 nm. The emission peak wavelength of the second light emitting element 20B is 490 nm or greater and 570 nm or less. For a semiconductor material of the semiconductor stack body, a nitride semiconductor is preferably used. The nitride semiconductor is generally expressed by general formula $In_xAl_yGa_{1-x-y}N$ (0≤x, 0≤y, x+y≤1). Other examples of the semiconductor material include an InAlGaAs-based semiconductor, an InAlGaP-based semiconductor, zinc sulfide, zinc selenide, silicon carbide and the like. The element substrate of each of the first light emitting element 20A, the second light emitting element 20B, and the third light emitting element 20C is generally a substrate for crystal growth, on which a semiconductor crystal forming the semiconductor stack layer can be grown. Alternatively, the element substrate may be a bonding substrate, which is to be bonded to the semiconductor element structure that has been separated from the substrate for crystal growth. The element substrate may be light-transmissive, which enables flip-chip mounting and facilitates increase in light extraction efficiency. The element substrate may be a substrate mainly containing sapphire, gallium nitride, aluminum nitride, silicon, silicon carbide, gallium arsenide, gallium phosphide, indium phosphide, zinc sulfide, zinc oxide, zinc selenide, diamond or the like. Among these materials, sapphire is preferable. The element substrate may have any appropriate thickness, and is, for example, in a range of 0.02 mm to 1 mm. In view of the strength of the element substrate and/or the thickness of the light emitting device, it is preferable that the thickness of the element substrate is in a range of 0.05 mm to 0.3 mm.

Light-Transmissive Member 30

The light-transmissive member 30 is disposed above the light emitting element 20, and protects the light emitting element 20. The light-transmissive member 30 contains a base material as described below. The light-transmissive member 30 may contain a wavelength conversion member as described below in the base material, so as to serve as a wavelength conversion member as well. The light-transmissive member 30 may not contain a wavelength conversion member. When the light-transmissive layer 30 has a layered structure, the layers of the light-transmissive layer 30 each include the base material as described below. The base material of the layers may be formed of the same material as, or different materials from, each other.

Base Material of the Light-Transmissive Member 30

The base material of the light-transmissive member 30 is transmissive to light emitted from the light emitting element 20. The term "light-transmissive" refers to having a light transmittance of preferably 60% or higher, more preferably 70% or higher, and still more preferably 80% or higher, of light at the emission peak wavelength of the first light emitting element 20A. For the base material of the light-transmissive member 30, a silicone resin, an epoxy resin, a phenol resin, a polycarbonate resin, an acrylic resin, or a modified resin thereof can be used. Alternatively, glass may be used for the base material of the light-transmissive member 30. Among these materials, a silicone resin and a modified silicone resin, which are highly resistant against heat and light, are preferable. Examples of the silicone resin include dimethyl silicone resin, phenyl-methyl silicone resin, and diphenyl silicone resin. The light-transmissive member 30 may include a single layer formed of one of the base materials described above, or may include a layered structure of two or more of the base materials described above. In this specification, the expression "modified resin" encompasses a hybrid resin. The "base material of the light-transmissive member 30" encompasses the base material of the first diffusive layer 31A, the base material of the second light-transmissive layer 31B, the base material of the wavelength conversion layer 31C, and the base material of the second diffusive layer 31D.

The light-transmissive member 30 may contain at least one diffusive member, e.g., various types of diffusive particles incorporated into the base material formed of resins described above or glass. For the diffusive particles, silicon oxide, aluminum oxide, zirconium oxide, zinc oxide or the like can be used. The diffusive particles may be formed of one material or a combination of two or more materials among these materials. Silicon oxide, which has a small coefficient of thermal expansion, is especially preferable. The diffusive particles may be nanoparticles, which allows for increase scattering of the light emitted from the light emitting element 20, and thus the amount of the wavelength conversion member to be used can be decreased. The "nanoparticles" as used herein refers to particles having a particle size in a range of 1 nm to 100 nm on average. In the present specification, the "particle size" refers to, for example, $D_{50}$.

Wavelength Conversion Member

The wavelength conversion member is adapted to absorb at least a portion of primary light emitted from the light emitting element 20 and to emit secondary light having a wavelength different from that of the primary light. The wavelength conversion member may comprise one material or a combination of two or more materials among the examples shown below. In the case where the light-transmissive member 30 includes a plurality of wavelength conversion layers, the wavelength conversion layers may include the same wavelength conversion material or different wavelength conversion materials.

Examples of wavelength conversion materials of the wavelength conversion member adapted to emit green light include a yttrium-aluminum-garnet-based phosphor (e.g., $Y_3(Al, Ga)_5O_{12}$: Ce), a lutetium-aluminum-garnet-based phosphor (e.g., $Lu_3(Al, Ga)_5O_{12}$: Ce), a terbium-aluminum-garnet-based phosphor (e.g., $Tb_3(Al, Ga)_5O_{12}$: Ce), a silicate-based phosphor (e.g., $(Ba, Sr)_2SiO_4$: Eu), a chlorosilicate-based phosphor (e.g., $Ca_8Mg(SiO_4)_4Cl_2$: Eu), a β-SiAlON-based phosphor (e.g., $Si_{6-z}Al_zO_zN_{8-z}$: Eu (0<z<4.2)), an SGS-based phosphor (e.g., $SrGa_2S_4$: Eu), and the like. Examples of wavelength conversion materials of the wavelength conversion member adapted to emit yellow light include an α-SiAlON-based phosphor (e.g., $M_z(Si, Al)_{12}(O, N)_{16}$ (0<z≤2; M is Li, Mg, Ca, Y, or a lanthanide element excluding La and Ce), and the like. The above-described examples of a wavelength conversion material of the wavelength conversion member adapted to emit green light include a wavelength conversion material adapted to also emit yellow light. For example, in the yttrium-aluminum-garnet-based phosphor, by substituting Gd with a portion of Y, the emission peak wavelength thereof can be shifted toward the longer wavelength side, which allows for emitting yellow light. The above-described examples of a wavelength conversion material of the wavelength conversion member adapted to emit yellow light include a wavelength conversion material adapted to also emit orange light. Examples of wavelength conversion materials of the wavelength conversion member adapted to emit red light include a nitrogen-containing calcium aluminosilicate (e.g., CASN or SCASN)-based phosphor, for example, $(Sr, Ca)AlSiN_3$: Eu, and the like. The examples of a material of the wavelength conversion member adapted to emit red light further include a manganese-activated fluoride-based phosphor (phosphor represented by general formula (I): $A_2[M_{1-a}M-n_aF_6]$ (in general formula (I), A is at least one selected from the group consisting of K, Li, Na, Rb, Cs and $NH_4$; M is at least one element selected from the group consisting of the group IV elements and the group XIV elements; and "a" satisfies 0<a<0.2)). A representative example of the manganese-activated fluoride-based phosphor is a manganese-activated potassium fluorosilicate phosphor (e.g., $K_2SiF_6$: Mn).

First Reflective Member 40

In view of the light extraction efficiency in the Z direction, the first reflective member 40 has a light reflectance of preferably 70% or higher, more preferably 80% or higher, and still more preferably 90% or higher, of light having the emission peak wavelength of the first light emitting element 20A. It is also preferable that the first reflective member 40 is white. Therefore, it is preferable that the first reflective member 40 contains a white pigment in the base material. The first reflective member 40 is in a liquid state before being cured. The first reflective member 40 may be formed by transfer molding, injection molding, compressing molding, potting or the like.

Base Material of the First Reflective Member 40

For the base material of the first reflective member 40 a resin such as a silicone resin, an epoxy resin, a phenol resin, a polycarbonate resin, an acrylic resin or a modified resin thereof can be used. Among these resins, a silicone resin and a modified silicone resin, which are highly resistant against heat and light, are preferable. Examples of the silicone resin include dimethyl silicone resin, phenyl-methyl silicone resin, and diphenyl silicone resin.

White Pigment

For the white pigment, a single material or a combination of two or more materials selected from the group consisting of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide can be used. The white pigment may have an appropriate shape, and may be irregular or crushed. It is preferable that the white pigment is spherical in view of fluidity. The white pigment may have an average particle size of, for example, about 0.1 µm or greater and about 0.5 µm or less. The smaller the white pigment, the more preferable for enhancing the effects of light reflection and covering. The content of the white pigment in the reflective member, which is light-reflective, may be of any appropriate value, and is, for example, preferably in a range of 10 wt. % to 80 wt. %, more preferably in a range of 20 wt. % to 70 wt. %, and still more preferably in a range of 30 wt. % to 60 wt. %, in view of the light reflectance, the viscosity in a liquid state, and the like. The "wt. %" herein refers to percent by weight, and represents the ratio of a weight of a material with respect to the total weight of the reflective member.

Second Reflective Member 41

The second reflective member 41 is located between the light emitting element 20 and the substrate 10. For the second reflective member 41, a reflective material substantially the same as that of the first reflective member 40 can be used.

Cover Member 70

The cover member 70 covers the light extraction surface of the light emitting elements 20, and diffuses light emitted from the light emitting elements 20 or converts light emitted from the light emitting elements 20 into light having an emission peak wavelength different from that of the light emitted from the light emitting elements 20.

Base Material of Cover Member 70

For a base material of the cover member 70, a material similar to that of the base material of the light-transmissive member 30 can be used.

Diffusive Particles of Cover Member 70

For the diffusive particles of the cover member 70, a material similar to that of the diffusive particles of the light-transmissive member 30 can be used.

Light Guide Member 50

The light guide member 50 covers the light emitting element 20 and the upper surface of the base member 11. Examples of the base material of the light guide member 50 include a silicone resin, an epoxy resin, a phenol resin, a polycarbonate resin, an acrylic resin and a modified resin thereof. Among these resins, a silicone resin and a modified silicone resin, which are highly resistant against heat and light, are preferable. Examples of the silicone resin include dimethyl silicone resin, phenyl-methyl silicone resin, and diphenyl silicone resin. The base material of the light guide member 50 may contain a filler, such as diffusive particles, wavelength conversion member, or the like, formed of a material similar to that of the light-transmissive member 30.

Conductive Bonding Member 60

Each of the conductive bonding members 60 electrically connects a corresponding electrode of a respective one of the light emitting elements 20 and a corresponding first wiring portion 12 to each other. For the conductive bonding members 60, bumps mainly containing gold, silver, copper or the like; metal pastes containing metal powder of silver, gold, copper, platinum, aluminum, palladium or the like and a resin binder; solders such as tin-bismuth based solder, tin-copper based solder, tin-silver based solder, gold-tin based solder or the like; or brazing material of a low melting-point metal material or the like can be used.

A light emitting device according to certain embodiments of the present invention can be used for, for example, backlight devices for liquid crystal display devices; various lighting devices; large-scale display devices; various display devices for advertisements, destination guides and the like; projector devices; and image reading devices for digital video cameras, facsimiles, copiers, scanners and the like.

While certain embodiments of the present invention has been described above, it will be apparent to those skilled in the art that the invention may be modified in numerous ways and may assume many embodiments other than those specifically described above. Accordingly, it is intended by the appended claims to cover all modifications of the invention that fall within the spirit and scope of the invention.

What is claimed is:

1. A light emitting device, comprising:
a substrate comprising:
a base member including an upper surface, a lower surface located opposite to the upper surface, and one or more lateral surfaces located between the upper surface and the lower surface, and defining a recess that is opened at the upper surface and the one or more lateral surfaces of the base member and surrounds an outer perimeter of the upper surface, and
first wiring portions disposed on the upper surface of the base member;
a first light emitting element electrically connected with corresponding ones of the first wiring portions and disposed on the corresponding ones of the first wiring portions, the first light emitting element having an emission peak wavelength of 430 nm or greater and less than 490 nm;
a second light emitting element electrically connected with corresponding ones of the first wiring portions and disposed on the corresponding ones of the first wiring portions, the second light emitting element having an emission peak wavelength of 490 nm or greater and 570 nm or less;
a light guide member covering the first light emitting element, the second light emitting element and the upper surface of the base member, the light guide member being spaced apart from the recess; and
a first reflective member having a closed-ring shape surrounding the upper surface of the base member and the light guide member, and being in contact with the light guide member, a portion of the first reflective member being located in the recess,
wherein at least one of the lateral surfaces of the base member and corresponding at least one of one or more outer lateral surfaces of the first reflective member are in the same plane.

2. The light emitting device according to claim 1, further comprising a light-transmissive member covering an upper surface of the first light emitting element and an upper surface of the second light emitting element, with the light guide member being located between the light-transmissive member and the upper surface of the first light emitting element and the upper surface of the second light emitting element.

3. The light emitting device according to claim 2, wherein the light-transmissive member contains a wavelength conversion member.

4. The light emitting device according to claim 3, wherein the light-transmissive member includes a first diffusive layer, a light-transmissive layer disposed on the first diffusive layer, a wavelength conversion layer disposed on the light-transmissive layer, and a second diffusive layer disposed on the wavelength conversion layer.

5. The light emitting device according to claim 1,
wherein the substrate has a rectangular shape in a plan view, and
wherein the first reflective member includes a first reflective portion extending along a longer side of the substrate and a second reflective portion extending along a shorter side of the substrate.

6. The light emitting device according to claim 5, wherein the first reflective portion has a width greater than a width of the second reflective portion in a plan view.

7. The light emitting device according to claim 5,
wherein the base member defines one or more recessed portions each opened at the lower surface of the base member and a corresponding one of the lateral surfaces of the base member, and
wherein the second reflective portion is spaced apart from the recessed portion in a plan view.

8. The light emitting device according to claim 1, wherein the first reflective member has a width in a range of 10 μm to 50 μm in a plan view.

9. The light emitting device according to claim 1, further comprising a second reflective member located between the substrate and a lower surface of the first light emitting element.

* * * * *